(12) United States Patent
Tutt et al.

(10) Patent No.: US 8,304,347 B2
(45) Date of Patent: *Nov. 6, 2012

(54) ACTUATING TRANSISTOR INCLUDING MULTIPLE REENTRANT PROFILES

(75) Inventors: Lee W. Tutt, Webster, NY (US); Shelby F. Nelson, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 7 days.

This patent is subject to a terminal disclaimer.

(21) Appl. No.: 12/986,218

(22) Filed: Jan. 7, 2011

(65) Prior Publication Data

US 2012/0176181 A1 Jul. 12, 2012

(51) Int. Cl.
 *H01L 21/311* (2006.01)
(52) U.S. Cl. ......... 438/699; 438/710; 438/714; 257/355
(58) Field of Classification Search .................. 438/699, 438/710, 714; 257/355, E27.014
See application file for complete search history.

(56) References Cited

U.S. PATENT DOCUMENTS

| | | | |
|---|---|---|---|
| 5,641,694 A | 6/1997 | Kenney | |
| 6,972,461 B1 | 12/2005 | Chen et al. | |
| 7,413,982 B2 | 8/2008 | Levy | |
| 7,456,429 B2 | 11/2008 | Levy | |
| 7,571,529 B2 | 8/2009 | Sirringhaus et al. | |
| 7,586,130 B2 | 9/2009 | Kawashima et al. | |
| 7,592,218 B2 | 9/2009 | Brown | |
| 7,629,633 B2 | 12/2009 | Chan et al. | |
| 7,985,684 B1 * | 7/2011 | Tutt et al. ................. | 438/699 |
| 2004/0108559 A1 * | 6/2004 | Sugii et al. ................. | 257/411 |
| 2005/0164464 A1 | 7/2005 | Hecht et al. | |
| 2006/0063351 A1 | 3/2006 | Jain | |
| 2006/0131697 A1 | 6/2006 | Wu et al. | |
| 2007/0131998 A1 | 6/2007 | Lin et al. | |
| 2008/0149913 A1 | 6/2008 | Tanaka et al. | |
| 2008/0166884 A1 | 7/2008 | Nelson et al. | |
| 2008/0227301 A1 | 9/2008 | Fang et al. | |
| 2009/0001470 A1 | 1/2009 | Anderson et al. | |
| 2009/0032803 A1 | 2/2009 | Appenzeller et al. | |

(Continued)

FOREIGN PATENT DOCUMENTS

JP 63-170971 7/1988

(Continued)

*Primary Examiner* — Theresa T Doan
(74) *Attorney, Agent, or Firm* — William R. Zimmerli

(57) ABSTRACT

A method of actuating a semiconductor device includes providing a transistor. The transistor includes a substrate. A first electrically conductive material layer is positioned on the substrate. A second electrically conductive material layer is in contact with and positioned on the first electrically conductive material layer. The second electrically conductive material layer includes a reentrant profile. The second electrically conductive material layer also overhangs the first electrically conductive material layer. An electrically insulating material layer is conformally positioned over the second electrically conductive material layer, the first electrically conductive material layer, and at least a portion of the substrate. A semiconductor material layer conforms to and is in contact with the electrically insulating material layer. A third electrically conductive material layer is nonconformally positioned over and in contact with a first portion of the semiconductor material layer. A fourth electrically conductive material layer is nonconformally positioned over and in contact with a second portion of the semiconductor material layer. A voltage is applied between the third electrically conductive material layer and the fourth electrically conductive material layer. A voltage is applied to the first electrically conductive material layer to electrically connect the third electrically conductive material layer and the fourth electrically conductive material layer.

2 Claims, 6 Drawing Sheets

U.S. PATENT DOCUMENTS

| | | |
|---|---|---|
| 2009/0085133 A1 | 4/2009 | Doan |
| 2009/0130858 A1 | 5/2009 | Levy |
| 2009/0166725 A1 | 7/2009 | Lee |

FOREIGN PATENT DOCUMENTS

| | | |
|---|---|---|
| JP | 2-140863 | 11/1990 |
| JP | 05-144744 | 6/1993 |
| JP | 2005-203395 | 7/2005 |
| JP | 2007-284766 | 11/2007 |
| JP | 2008-103636 | 5/2008 |
| KR | 2009-0017045 | 2/2009 |
| KR | 2009-0017046 | 2/2009 |
| WO | WO 89/05516 | 6/1989 |

* cited by examiner

ACTUATING TRANSISTOR INCLUDING MULTIPLE REENTRANT PROFILES

CROSS REFERENCE TO RELATED APPLICATIONS

Reference is made to commonly-assigned, U.S. patent applications Ser. No. 12/986,199, entitled "ACTUATING TRANSISTOR INCLUDING REDUCED CHANNEL LENGTH", Ser. No. 12/986,206, entitled "PRODUCING TRANSISTOR INCLUDING REDUCED CHANNEL LENGTH", Ser. No. 12/986,210, entitled "TRANSISTOR INCLUDING MULTIPLE REENTRANT PROFILES", Ser. No. 12/986,197, entitled "TRANSISTOR INCLUDING REDUCED CHANNEL LENGTH", and Ser. No. 12/986,236, entitled "PRODUCING TRANSISTOR INCLUDING MULTIPLE REENTRANT PROFILES", all filed concurrently herewith.

FIELD OF THE INVENTION

This invention relates generally to semiconductor devices, and in particular to transistor devices.

BACKGROUND OF THE INVENTION

In semiconductor processing technology, planar substrate surfaces which are horizontal with respect to a wafer surface are patterned by photolithographic methods in combination with selective etching processes. During the processing of integrated circuits, reliefs with a pronounced topography are formed on the wafer or substrate surface. Typically, this type of relief includes surfaces which are inclined or vertical with respect to the substrate surface. As sizes of integrated circuits continue to shrink, it is becoming more and more necessary to pattern vertical or inclined device surfaces so as to functionally differentiate these devices over their vertical extent while still maintaining pattern alignment. Examples of these types of semiconductor devices include deep trench capacitors, stacked capacitors, and vertical transistors.

Currently, it is not possible to put patterns directly on walls which are vertical with respect to the substrate surface using conventional photolithographic techniques. Usually, vertical wall patterning of this nature is accomplished using a suitable filler material which, when partially filling in a trench, acts as a mask for the portions of the wall located underneath while allowing for processing of the walls above the filler material. For example, when an oxide is to be deposited exclusively on vertical walls below a filler material, the oxide is first deposited or produced over the entire surface of the relief. The relief or trench is initially completely filled with a suitable filler material. Then, the filler material is recessed back to a depth that just covers the desired oxide. After uncovered sections of the oxide are removed, the remaining filler material is removed.

Alternatively, when an oxide is to be deposited or produced only in upper regions of a vertical wall, an etching stop layer, for example, a nitride layer is first provided over the entire surface of the entire relief pattern. A different material, susceptible to directional etching, for example, polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and, then, the removal of the etching stop layer.

There are deposition processes which can be used to deposit thin films on vertical or inclined surfaces of a substrate relief. However, it is difficult to control the thickness of the layer deposited. Typically, the thickness of the coating decreases as the depth of the relief increases, for example, as the length of the vertical or inclined wall increases. As such, layers deposited using these types of deposition processes have considerable differences in thickness over the length of the relief. These types of deposition processes include plasma-enhanced chemical vapor deposition (PECVD) and diffusion-limited deposition of silicon oxide using tetraethyl orthosilicate (TEOS).

As such, there is an ongoing need to provide semiconductor device architectures that include patterned vertical or inclined device surfaces. There is also an ongoing need to provide manufacturing techniques capable of processing small device features of semiconductor devices without requiring high resolution alignment tolerances. There is also an ongoing need to provide higher current semiconductor devices by improving the series resistance of the device.

SUMMARY OF THE INVENTION

According to one aspect of the present invention, a method of actuating a semiconductor device includes providing a transistor. The transistor includes a substrate. A first electrically conductive material layer is positioned on the substrate. A second electrically conductive material layer is in contact with and positioned on the first electrically conductive material layer. The second electrically conductive material layer includes a reentrant profile. The second electrically conductive material layer also overhangs the first electrically conductive material layer. An electrically insulating material layer is conformally positioned over the second electrically conductive material layer, the first electrically conductive material layer, and at least a portion of the substrate. A semiconductor material layer conforms to and is in contact with the electrically insulating material layer. A third electrically conductive material layer is nonconformally positioned over and in contact with a first portion of the semiconductor material layer. A fourth electrically conductive material layer is nonconformally positioned over and in contact with a second portion of the semiconductor material layer. A voltage is applied between the third electrically conductive material layer and the fourth electrically conductive material layer. A voltage is applied to the first electrically conductive material layer to electrically connect the third electrically conductive material layer and the fourth electrically conductive material layer.

BRIEF DESCRIPTION OF THE DRAWINGS

In the detailed description of the preferred embodiments of the invention presented below, reference is made to the accompanying drawings, in which.

DETAILED DESCRIPTION OF THE INVENTION

Figure 1:
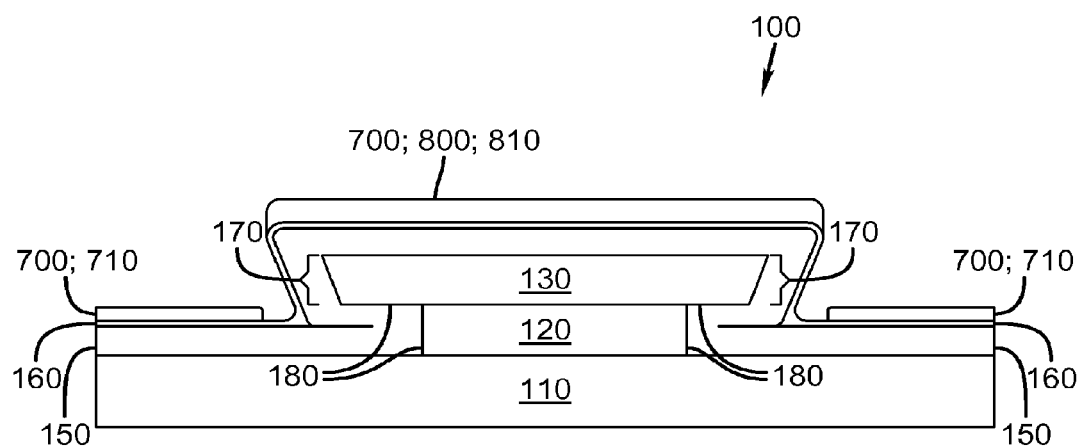
FIG. 1 is a schematic cross sectional view of an example embodiment of a vertical transistor made in accordance with the present invention.

The present description will be directed in particular to elements forming part of, or cooperating more directly with, apparatus in accordance with the present invention. It is to be understood that elements not specifically shown or described may take various forms well known to those skilled in the art. In the following description and drawings, identical reference numerals have been used, where possible, to designate identical elements.

The example embodiments of the present invention are illustrated schematically and not to scale for the sake of clarity. One of ordinary skill in the art will be able to readily determine the specific size and interconnections of the elements of the example embodiments of the present invention.

Referring to FIG. 1, a schematic cross sectional view of a vertical transistor 100 is shown. Transistor 100 includes a substrate 110, a first electrically conductive material layer 120, and a second electrically conductive material layer 130. Transistor 100 also includes an electrically insulating material layer 150 and a semiconductor material layer 160. An electrode or electrodes 710 and an electrode 810 are also included in transistor 100.

Conductive layer 120 is positioned between substrate 110 and second electrically conductive material layer 130. A first surface of conductive layer 120 contacts a first surface of substrate 110 while a second surface of conductive layer 120 contacts a first surface of second electrically conductive layer 130. Substrate 110, often referred to as a support, can be rigid or flexible.

Second electrically conductive material layer 130 is appropriately dimensioned (or sized), positioned, or dimensioned and positioned relative to first electrically conductive material layer 120 to create a reentrant profile 170 in transistor 100. As such, it can be said that at least a portion of second conductive layer 130 defines the reentrant profile 170 of transistor 100. The reentrant profile 170 shields at least some of second electrically conductive material layer 130 from material deposited (or coated) using a directional (or line of sight) deposition (or coating) process. Alternatively stated, the second electrically conductive material layer 130 itself has a reentrant profile because a first portion of second electrically conductive material layer 130 overhangs a second portion of second electrically conductive material layer 130.

Figure 4:
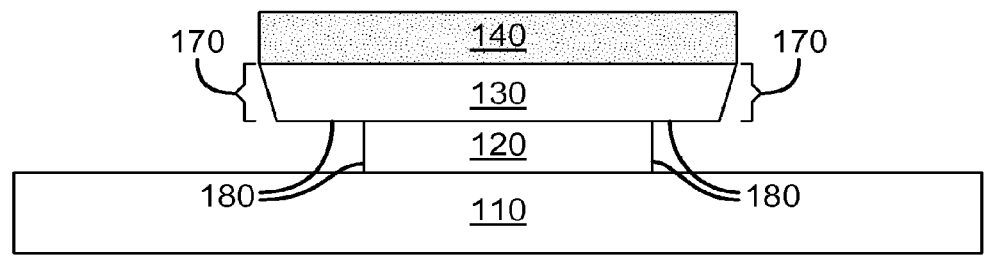
Figure 5:
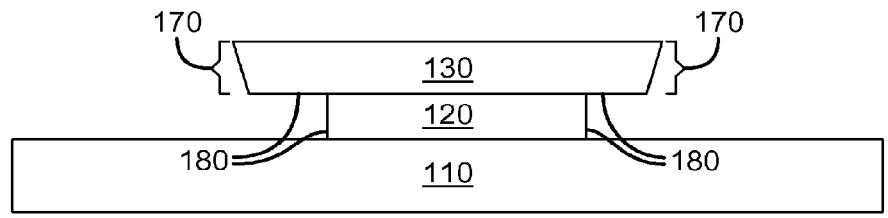

The second electrically conductive layer 130 is also dimensioned (or sized) and positioned to extend beyond (or overhang) conductive layer 120. Alternatively stated, first electrically conductive layer 120 is dimensioned (or sized) and positioned to stop at both ends (in both the left and right directions as shown in FIG. 1) before both ends of second electrically conductive layer 130 stop so that second electrically conductive layer 130 creates an overhang 180 (also shown in FIG. 4). Alternatively stated, the second electrically conductive material layer 130 creates a reentrant profile relative to the first electrically conductive material layer 120.

Electrically insulating material layer 150 conforms to the reentrant profile 170 and overhang 180 of transistor 100. Electrically insulating material layer 150 includes first and second surfaces with the first surface being in contact with portions of surfaces of second electrically conductive material layer 130, first electrically conductive layer 120, and substrate 110. Semiconductor material layer 160 conforms to electrically insulating material layer 150. Semiconductor layer 160 includes first and second surfaces with the first surface being in contact with the second surface of electrically insulating layer 150. Distinct (or separate, or different) portions of the second surface of semiconductor layer 160 are in contact with electrode(s) 710 and electrode 810.

The thickness of the first electrically conductive material layer 120 is more than the thickness of the electrically insulating layer 150 and preferably equal to twice the thickness of the electrically insulating layer 150. The thickness of the first electrically conductively layer 120 can also be sized so that it is less than twice the sum of the thicknesses of electrically insulating layer 150 and semiconducting layer 160. Sizing the thickness of the first electrically conductive material layer 120 in this manner allows the conformal coating of the electrically insulating material layer 150 and, if necessary, a portion of the semiconducting material layer 160 to fill in the overhang 180 which ultimately shortens the channel path (or length) and reduces or even prevents ungated regions in transistor 100.

Electrode(s) 710 includes a third electrically conductive material layer 700. When there is more than one electrode 710, different discrete discontinuous portions of third electrically conductive material layer 700 form electrodes 710. Electrode 810 includes a fourth electrically conductive material layer 800. Electrode(s) 710 and electrode 810 are positioned spaced apart from each other at different locations of transistor 100. Electrode(s) 710 and electrode 810 can be different portions of the same material layer. When this happens, the third and fourth electrically conductive material layers 700 and 800 are different discrete discontinuous portions of the same material layer, for example, material layer 700. The material layer, for example, layer 700, is preferably deposited in a single collimated deposition during which reentrant profile 170 electrically separates each electrode from the other electrodes such that electrode(s) 710 and electrode 810 are included on distinct (different) discontinuous portions of the same electrically conductive material layer. Alternatively, the third and the fourth electrically conductive material layers 700, 800 can be distinct (different) material layers that are used to form electrode(s) 710 and 810.

Electrically conductive material layers 120 and 130 function as the gate of transistor 100. In some example embodiments of transistor 100, one or both of electrodes 700 function as the drain of transistor 100 while electrode 810 functions as the source of transistor 100. In other example embodiments of transistor 100, one or both of electrodes 700 function as the source while electrode 810 functions as the drain.

The semiconductor device is actuated in the following manner. After transistor 100 is provided, a voltage is applied between the third electrically conductive material layer 700 and the fourth electrically conductive material layer 800. A voltage is also applied to the first electrically conductive material layer 120 to electrically connect the third electrically conductive material layer 700 and the fourth electrically conductive material layer 800. Since first electrically conductive material layer 120 and second electrically conductive material layer 130 are both electrically conductive and in contact with each other, applying a voltage to one layer, for example, layer 120, is considered to be equivalent to applying a voltage to both layers, layers 120 and 130, or the other layer, for example, layer 130. The third electrically conductive material layer 700 and the fourth electrically conductive material layer 800 can be the same material layer or can be different material layers.

The reentrant profile 170 of transistor 100 allows a dimension of the semiconductor material channel of the transistor to be associated with the thickness of the second electrically conductive material layer 130, which functions as the gate, of transistor 100. Advantageously, this architecture of the present invention reduces reliance on high resolution or very fine alignment features during the manufacture of transistors that include small channels.

Referring to FIGS. 2 through 8B, schematic cross sectional views of process steps associated with an example embodiment of a method of manufacturing transistor 100 are shown.

Generally described, transistor 100 is fabricated in the following manner. A substrate 110 is provided including in order a first electrically conductive material layer 120 and a second electrically conductive material layer 130. A resist material layer 140 is deposited over second electrically conductive material layer 130. Resist material layer 140 is patterned to expose a portion of second electrically conductive material layer 130, shown in FIG. 2. The exposed portion of second electrically conductive material layer 130 is removed using a process which tends to create a first reentrant profile in the second electrically conductive mater layer 130, for example, plasma etching, to expose a portion of electrically conductive material layer 120. The exposed portion of electrically conductive material layer 120 is removed, shown in FIG. 3. Continued removal of conductive material layer 120 creates overhang 180 (which can be referred to as a second reentrant profile) in which second electrically conductive material layer 130 extends beyond first electrically conductive material layer 120, shown in FIG. 4. Alternatively stated, first electrically conductive material layer 120 underhangs the second electrically conductive material layer 130.

Figure 6:
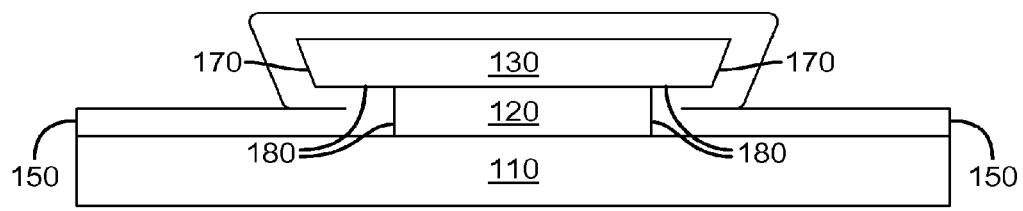

After removal of photoresist material layer 140 (shown in FIG. 5), if such is necessary, substrate 110 and the remaining exposed portions of electrically conductive material layers 120 and 130 are conformally coated with an electrically insulating material layer 150, shown in FIG. 6. The thickness of the electrically insulating material layer 150 is less than the thickness of first electrically conductive material layer 120, and preferably half the thickness of first electrically conductive material layer 120 so that the overhang 180 between the substrate 110 and the second electrically conductive material layer 130 can be substantially filled in. Electrically insulating material layer 150 is conformally coated with a semiconductor material layer 160, shown in FIG. 7. An electrically conductive material layer, for example, material layer 700 or material layer 700 and material layer 800, is directionally (or nonconformally) deposited (shown using arrows 900) over semiconductor material layer 160, shown in FIG. 8A.

The resist material layer 140 can be deposited over second electrically conductive material layer 130 and patterned in the same process step. A plasma can be used to remove the exposed portion of the second electrically conductive material layer 130 to expose a portion of the electrically conductive material layer 120 and create reentrant profile 170. The same plasma that is used to remove the exposed portion of the second electrically conductive material layer 130 can be used to remove the exposed portion of the first electrically conductive material layer 120 to create the reentrant profile 180 in the electrically conductive material layer 120 if the etch rate of first electrically conductive material layer 120 is faster than second electrically conductive material layer 130. In some embodiments the first electrically conductive material layer is wet etched with an etchant which does not etch the second electrically conductive material layer 130 to create the reentrant profile 180.

In some example embodiments, substrate 110 can include more than one material layer. The additional material layer(s) is included in some instances to improve or maintain the structural integrity of substrate 110 during the manufacturing process. When substrate 110 includes more than one material layer, for example, a first material layer and a second material layer, the fabrication method can include removing the second material layer of substrate 110.

Figure 2:
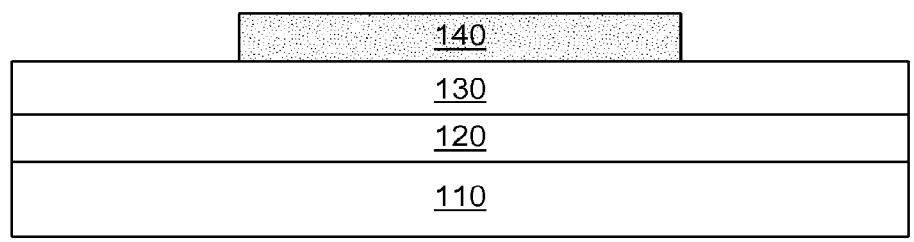
FIGS. 2 through 8B are schematic cross sectional views of process steps associated with an example embodiment of a method of producing the vertical transistor shown in FIG. 1.

Referring back to FIG. 2, vertical transistor device 100 begins with a substrate 110 that is non-conductive, either in whole or in part with respect to at least the portion of the substrate that is adjacent to conductive material layer 120 (the top of the substrate 110 as shown in FIG. 2), such that electrical shorting of transistor 100 does not occur. Conductive material layer 120 is applied to (for example, deposited or coated) onto substrate 110. Conductive material layer 120 functions as part of the gate of transistor 100 and by its thickness (in the vertical direction as shown in FIG. 2) defines a length approximately twice the insulator thickness by its thickness. A second electrically conductive material layer 130 is applied on conductive material layer 120. Conductive material layer 130 is a uniform material layer with no pattern. A resist material layer 140 is applied to conductive material layer 130. Resist 140 is patterned.

Substrate 110 does not interact appreciably with any of the material layers or the processing methods. Substrate 110, often referred to as a support, can be used for supporting the thin film transistor (also referred to as a TFT) during manufacturing, testing, or use. Those skilled in the art will appreciate that a support selected for commercial embodiments can be different from one selected for testing or screening embodiments. In some embodiments, substrate 110 does not provide any necessary electrical function for the TFT. This type of substrate 110 is termed a "non-participating support" herein. Useful substrate materials include organic or inorganic materials. For example, substrate 110 can include inorganic glasses, ceramic foils, polymeric materials, filled polymeric materials, coated metallic foils, acrylics, epoxies, polyamides, polycarbonates, polyimides, polyketones, poly (oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of substrate 110 can vary, typically from about 100 μm to about 1 cm.

A flexible support or substrate 110 is used in some example embodiments of the present invention. Using a flexible substrate 110 allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an electrically insulating material layer to electrically isolate the thin film transistor. If flexibility is not a concern, then the substrate can be a wafer or sheet made of materials including glass and silicon.

In some example embodiments, substrate 110 can include a temporary support or support material layer, for example, when additional structural support is desired for a temporary purpose, e.g., manufacturing, transport, testing, or storage. In these example embodiments, substrate 110 can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The electrically conductive material layers 120 and 130, commonly referred to as conductors, can be any suitable conductive material that permits conductive material layers 120 and 130 to function as a gate. A variety of gate materials known in the art are also suitable, including metals, degenerately doped semiconductors, conductive polymers, and printable materials such as carbon ink, silver-epoxy, or sinterable metal nanoparticle suspensions. For example, the gate electrode can include doped silicon, or a metal, such as aluminum, chromium, gold, silver, nickel, copper, tungsten, palladium, platinum, tantalum, and titanium. Gate electrode materials can also include transparent conductors such as indium-tin oxide (ITO), ZnO, SnO2, or In2O3. Conductive polymers also can be used, for example polyaniline, poly(3,4-ethylenedioxythiophene)/poly(styrene sulfonate) (PEDOT:PSS). In addition, alloys, combinations, and multilayers of these materials can be used. The gate electrode (layers 120 and 130) can be deposited on substrate 110 using chemical vapor deposition, sputtering, evaporation, doping, or solution processing The thickness (the vertical direction as shown in FIG. 2) of the gate electrode can vary, typically from about 100 to about 10000 nm. As the thickness defines the gate length, the thickness is usually thicker than twice the thickness of the conformally coated materials in order to reduce the likelihood of electrical shorting in subsequent applied material layers.

Resist 140 can be a conventional photoresist known in the art such as a polymeric positive acting resist or a negative resist. Resist 140 can be exposed through a mask with a low resolution (>0.1 mm) alignment to substrate 110 and developed to yield a pattern of resist. In another example embodiment, the pattern of resist 140 is accomplished using a printing process, for example, flexography or inkjet printing, that prints the resist directly in a patterned manner without using a mask.

Figure 3:
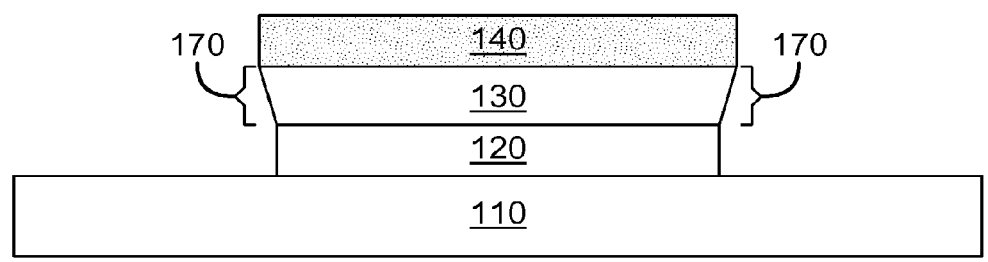

Referring back to FIG. 3, a schematic cross sectional view of transistor 100 material layers during and after material processing are shown. In FIG. 3, second electrically conductive material layer 130, commonly referred to as a second conductor, is etched through patterned resist 140 to create a first reentrant profile 170. The etchant can be any organic or inorganic material which, when used in a suitable etching process, removes the conductive material without substantial attacking resist 400 and provides the reentrant profile 170. First electrically conductive material layer 120, commonly referred to as a first conductor, is then removed using a suitable etchant which removes the first conductor 120, but has little impact on substrate 110 or the overlying second conductor 130. As such, the selected etchant often depends on the substrate 110, the conductor, 120, or the nonconductor 130. Etchant interaction with resist 140 and loss of the resist 140 at this point is usually of little consequence, since the second conductor 130 now acts as a mask. As shown in FIG. 3, the etching process or processes used may etch away portions of first conductor 120 and second conductor 130 such that first conductor 120 and nonconductor 130 have the same pattern except for the reentrant profile 170 in the second conductor 130.

Referring back to FIG. 4, selective etching of first conductor 120 is continued until the overhang 180 (a second reentrant profile 180) is formed. When etching of first conductor 120 is complete, second conductor 130 overhangs first conductor 120 which creates a reentrant profile 180 that allows the dielectric nonconductive material 150 to substantially fill in when the dielectric nonconductive material 150 is deposited using a conformally coating process. Alternatively stated, conductor 120 underhangs nonconductor 130. The remaining conductor 120 acts as the conductor which is electrically part of the gate when the semiconductor device is complete.

Referring back to FIG. 5, at this point, if it is necessary, resist 140 is removed. Gentle cleaning can be performed on the material layer stack, if desired, provided that the cleaning process does not remove the reentrant profile 170.

Referring back to FIGS. 6 and 7, schematic cross sectional views of the semi-conductor device after conformal coating of a dielectric nonconductive material, often referred to as an insulator, and a semiconductor material, respectively, are shown. In FIG. 6, a dielectric nonconductive material 150 is then conformally coated using a conformal coating deposition process over substrate 110 and the topographic feature formed by conductive material layers 120 and 130. Applying a dielectric nonconductive material 150 using a conformal coating process helps to maintain the reentrant profile 170. Since the first electrically conductive layer 120 is about twice the thickness of the dielectric nonconductive material 150 the reentrant profile 180 can be filled-in and helps to maintain a sharp corner. The dielectric nonconductive material 150 is often referred to as the gate dielectric. Suitable nonconductive materials include strontiates, tantalates, titanates, zirconates, aluminum oxides, silicon oxides, tantalum oxides, titanium oxides, silicon nitrides, barium titanate, barium strontium titanate, barium zirconate titanate. As the dielectric material separates the gate conductor from the semiconductor material that is to be applied, it is important that the conformally coated material be provided with a consistent or uniform thickness at least in the region where the reentrant profile 170 and the gate are located.

Preferred processes for accomplishing conformal coating include atomic layer deposition (ALD) or one of its derivatives such as spatial ALD (S-ALD) or plasma enhanced ALD (PEALD) because these processes yield a uniform thickness coating over or on a highly varying topology. ALD and S-ALD are discussed in more detail below.

Figure 7:
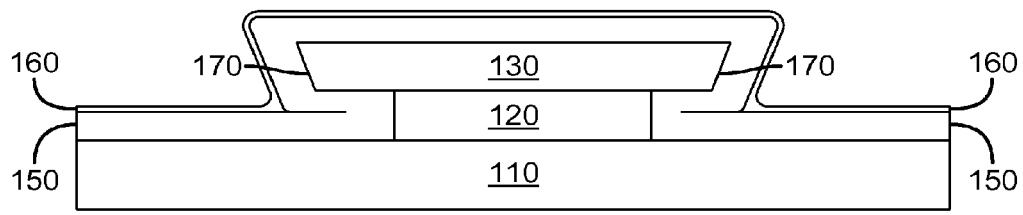
Figure 8A:
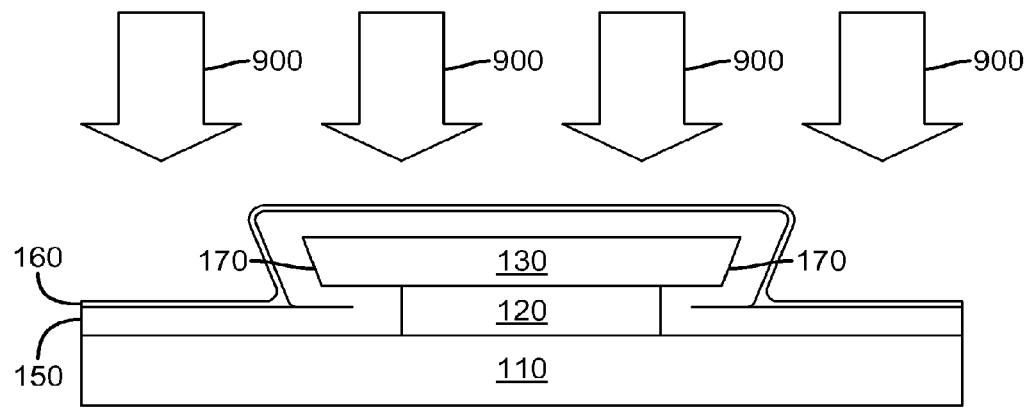
Figure 8B:
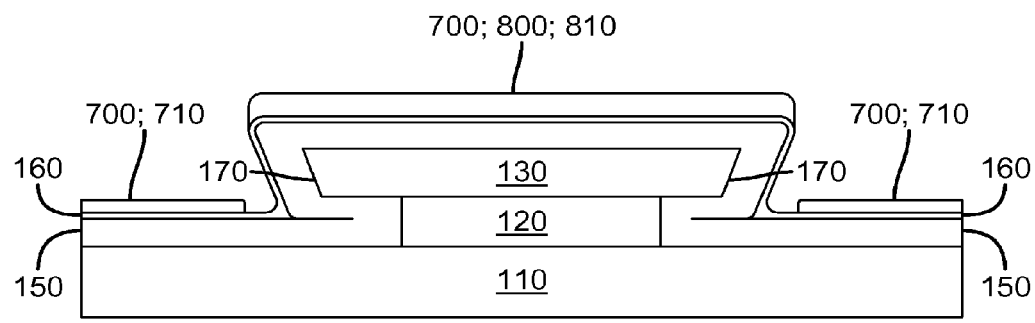

In FIG. 7, a semiconductor material 160 is then coated using a conformal coating deposition process which helps to maintain the reentrant profile 170. This conformal coating process can be the same process used previously to coat the dielectric material. Alternatively, the conformal coating process can be different. As the semiconductor material 160 acts as a channel between electrode(s) 710 and electrode 810 when first conductor 120 is energized, it is important that the conformally coated material be provided with a consistent or uniform thickness at least in the region where the reentrant profile 170 and the gate are located and more preferable in the areas between electrode(s) 710 and electrode 810 including the area where the reentrant profile 170 and the gate are located. A preferred process for conformally coating includes atomic layer deposition (ALD) or spatial ALD (S-ALD), a derivative of ALD. Either process yields a uniform thickness on a highly varying topology.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed is removed from the vacuum chamber. A second precursor is then applied to react with the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. Nos. 7,413,982, 7,456,429, US 2008/0166884, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for manufacturing the present invention.

The semiconductor material layer 160, often referred to as a semiconductor, can be any type of semiconductor provided the semiconductor material can be deposited or coated using a conformal coating process such as ALD or S-ALD. Examples of suitable semiconductor materials include zinc oxide, zinc chalcogenides, indium tin oxides, gallium indium tin oxides, gallium tin oxides, cadmium chalcogenides, gallium pnictides, aluminum nictides, germanium, and silicon.

The semiconductor can optionally be doped with other materials to increase or decrease the conductivity. In some example embodiments, a depletion mode device is desirable, and therefore carriers can be added through the use of dopants. When the semiconductor is a zinc oxide, the use of an aluminum dopant, for example, increases the electron carrier density. In this configuration, the gate is typically used to turn off the device by making it negative relative to the drain and source.

A compensating dopant can also be used to deplete the intrinsic carrier density. When the semiconductor is zinc oxide, the use of nitrogen has been found to decrease the electron carrier density making it less n-type. In this configuration, the semiconductor can be made to operate in an accumulation mode to turn on the transistor when a positive gate voltage is applied. These dopants are often added as compounds during the growth process but can also be added after the semiconductor material layer has been applied using a process such as ion implantation and thermal diffusion.

Referring back to FIGS. 8A and 8B, a schematic cross sectional view of the semi-conductor device during directional coating of an electrically conductive material is shown. After semiconductor material layer 160 has been deposited, the source and drain electrode(s) 710 and electrode 810 are deposited using a directional (or line-of-sight) deposition process which does not deposit or coat material into the reentrant profile 170. This can also be referred to as a non-conformal deposition process. Examples of suitable directional deposition processes include thermal evaporation, electron beam evaporation, sputtering, or laser ablation. The active channel gap between electrode(s) 710 and electrode 810 is maintained by the shadow casted by the reentrant profile 170 of second electrically conductive material layer 130.

The drain and the source of transistor 100 can be selected from either of electrode 700 and electrode 810 with the selection typically being based on the application and the characteristics of the contemplated device. As shown in FIG. 1, electrode 810 is on the top of the mesa formed by conductor 130 and conductor 120 while electrode(s) 710 is not. As such, electrode 700 and electrode 810 are on different planes. Any necessary interconnects can be accomplished using conventional techniques that are well known in the art, for example, material layer leveling and via feed-through.

Substrate 110, first electrically conductive material layer 120, second electrically conductive material layer 130, dielectric nonconductive material layer 150, semiconductor material layer 160, electrode(s) 710, or combinations thereof can include one or more layers provided the functional aspect of the layer remains unchanged. Additional layers, for example, leveling layers, barrier layers, adhesion layer, can be included in the semiconductor device as long as the function of the layers described above is preserved.

Experimental Results

A 120 nm material layer of aluminum was deposited via sputtering on a 62.5 mm square glass substrate. On top of this, a 460 nm molybdenum material layer was coated deposited via sputtering.

A patterned material layer of photoresist was formed by spin coating at 1000 rpm Microposit S1805 resist (Rohm and Haas Electronic Materials LLC, Marlborough, Mass.) placed on a hot plate for 60 sec at 115 degrees Celsius and then exposed through a glass/chromium contact mask including lines for 75 seconds on a Cobilt mask aligner (Cobilt model CA-419 from Computervision Corporation, Sunnyvale, Calif.), using only the edges of the silicon substrate as a low resolution or crude alignment. The sample was then developed for 60 seconds in Microposit MF-319 developer (Rohm and Haas Electronic Materials LLC, Marlborough, Mass.) and rinsed for 5 minutes in DI water.

The conductive molybdenum was plasma etched with 0.3 torr SF6 at 200 W for 8 minutes using a Technics plasma etcher. The aluminum was then etched at 60 degrees Celsius with concentrated phosphoric acid for 1.25 minutes. The substrate was then rinsed in DI water for 5 minutes, rinsed with acetone to remove the photo resist, then rinsed in HPLC grade isopropanol, and then allowed to dry.

The substrate was then conformally coated with a material layer 60 nm thick of aluminum oxide at 200 degrees Celsius using the S-ALD process described in U.S. Pat. No. 7,413,982 and the S-ALD apparatus described in U.S. Pat. No. 7,456,429 with the organo-metallic precursors trimethyl aluminum and water with an inert carrier gas of nitrogen.

The substrate was then coated with a 25 nm material layer of zinc oxide at 200 degrees Celsius using the precursors diethyl zinc and concentrated ammonia solution and nitrogen as the carrier gas.

The electrodes were applied by evaporation. Aluminum was evaporated through a shadow mask including square holes which ran perpendicular and completely cross each line on the substrate. The aluminum was 70 nm thick.

Figure 9:
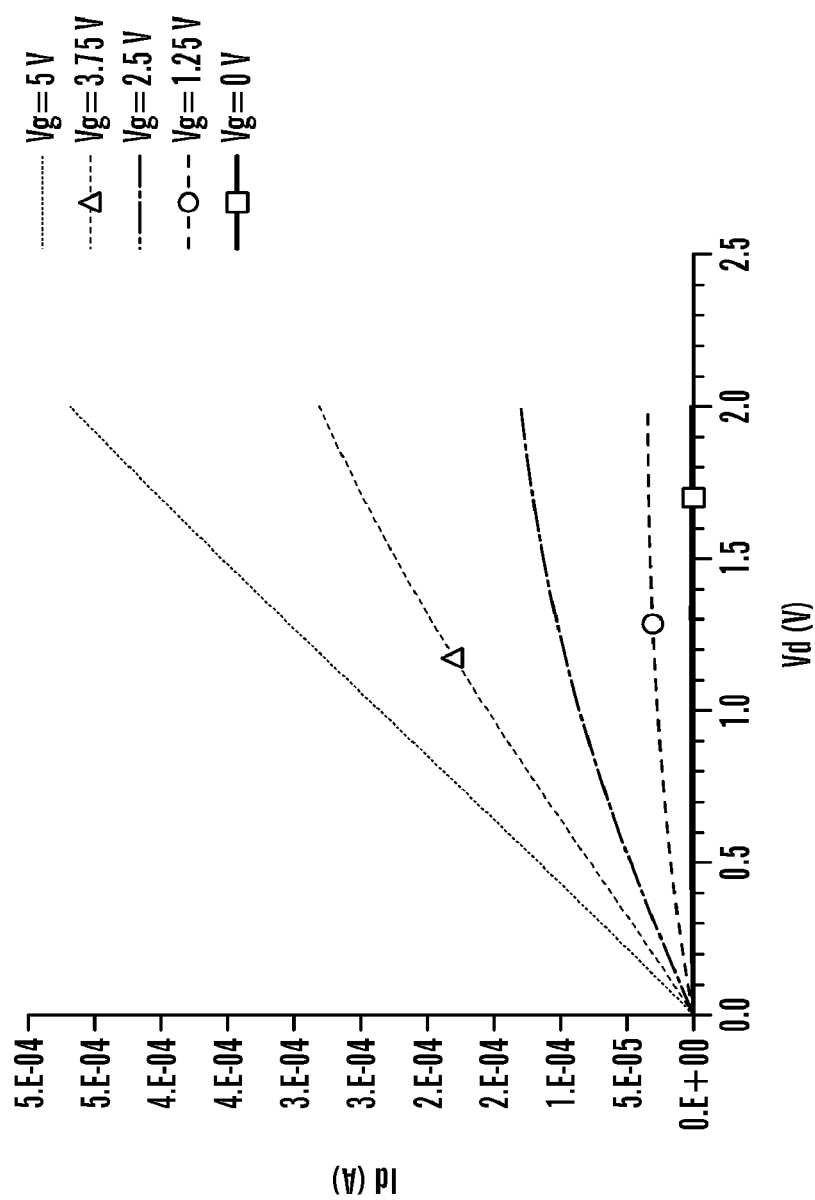
FIG. 9 is a graph showing performance $I_d$-$V_d$ curve characteristics for the transistor shown in FIG. 1.

Testing of the transistor was accomplished by using a probe station to contact the aluminum on top of the line, the aluminum on one side of the line and the chromium gate metal which acts as the gate. Referring to FIG. 9, a graph showing performance $I_d$-$V_d$ curve characteristics for the transistor is shown. As can be seen in FIG. 9, the drain current versus drain voltage is very responsive to the gate voltage.

Figure 10:
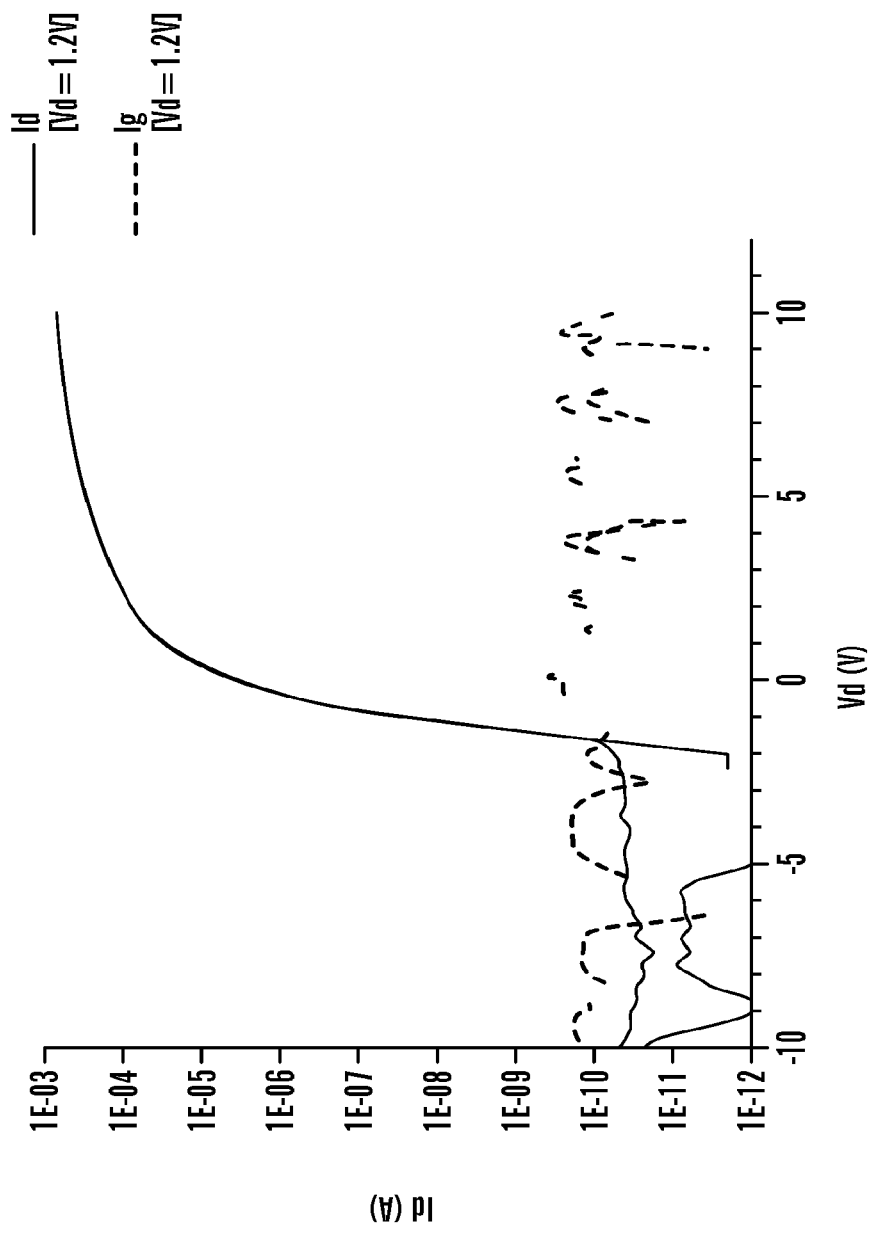
FIG. 10 is a graph showing performance transfer characteristics for the transistor shown in FIG. 1.

Referring to FIG. 10, a graph showing performance transfer characteristics for the transistor is shown. As can be seen in FIG. 10, the drain current responds well to the gate voltage, ranging from a small current of about $10^{-11}$ amps at a gate of −2 volts to almost a milliamp at a gate of 10 volts for a drain voltage of 1.2 volts. The gate current, which has very little leakage at all gate voltages, is also shown The invention has been described in detail with particular reference to certain preferred embodiments thereof, but it will be understood that variations and modifications can be effected within the scope of the invention.

PARTS LIST 100 transistor
110 substrate
120 first conductor
130 second conductor
140 resist
150 a dielectric nonconductive material
160 semiconductor
170 reentrant profile
180 overhang or second reentrant profile
700 third electrically conductive material layer
710 electrode(s)
800 fourth electrically conductive material layer
810 electrode
900 directional (nonconformal) deposition arrow

The invention claimed is:

1. A method of actuating a semiconductor device comprising:
   providing a transistor including:
      a substrate;
      a first electrically conductive material layer positioned on the substrate; and
      a second electrically conductive material layer in contact with and positioned on the first electrically conductive material layer, the second electrically conductive material layer including a reentrant profile in which a first portion of the second electrically conductive material layer overhangs a second portion of the second electrically conductive material layer, the second electrically conductive material layer overhanging the first electrically conductive material layer;
      an electrically insulating material layer conformally positioned over the second electrically conductive material layer, the first electrically conductive material layer, and at least a portion of the substrate;
      a semiconductor material layer that conforms to and is in contact with the electrically insulating material layer;
      a third electrically conductive material layer nonconformally positioned over and in contact with a first portion of the semiconductor material layer;
      a fourth electrically conductive material layer nonconformally positioned over and in contact with a second portion of the semiconductor material layer;
   applying a voltage between the third electrically conductive material layer and the fourth electrically conductive material layer; and
   applying a voltage to the first electrically conductive material layer to electrically connect the third electrically conductive material layer and the fourth electrically conductive material layer.

2. The method of claim 1, the third electrically conductive material layer and the fourth electrically conductive material layer being different portions of the same material layer, wherein applying a voltage between the third electrically conductive material layer and the fourth electrically conductive material layer includes applying a voltage to different discontinuous portions of the same material layer.

* * * * *